(12) United States Patent
Hussey et al.

(10) Patent No.: US 7,056,000 B2
(45) Date of Patent: Jun. 6, 2006

(54) APPARATUS FOR TESTING A LIGHT EMITTING DEVICE, AND A METHOD FOR TESTING LIGHT EMITTING DEVICES

(75) Inventors: Conleth Denis Hussey, Limerick (IE); Kenneth Peter Oakley, Limerick (IE); Michael Crowley, Limerick (IE); Eamonn O'Toole, Limerick (IE); Timothy Davern, Limerick (IE)

(73) Assignee: Viveen Limited, County Limerick (IE)

( * ) Notice: Subject to any disclaimer, the term of this patent is extended or adjusted under 35 U.S.C. 154(b) by 291 days.

(21) Appl. No.: 10/258,658

(22) PCT Filed: Apr. 27, 2001

(86) PCT No.: PCT/IE01/00055

§ 371 (c)(1),
(2), (4) Date: Mar. 21, 2003

(87) PCT Pub. No.: WO01/84901

PCT Pub. Date: Nov. 8, 2001

(65) Prior Publication Data

US 2003/0161163 A1 Aug. 28, 2003

(30) Foreign Application Priority Data

Apr. 28, 2000 (IE) ................................. S2000/0322

(51) Int. Cl.
*H01L 27/00* (2006.01)
*F21V 7/04* (2006.01)

(52) U.S. Cl. .................... 362/555; 362/554; 250/208.1; 250/226

(58) Field of Classification Search ............. 250/208.1, 250/226; 362/555, 800, 554
See application file for complete search history.

(56) References Cited

U.S. PATENT DOCUMENTS 4,775,640 A * 10/1988 Chan ........................... 438/16
4,808,815 A * 2/1989 Langley ................ 250/227.28

FOREIGN PATENT DOCUMENTS

EP 0 285 493 A 10/1988

* cited by examiner

*Primary Examiner*—Thomas M. Sember
*Assistant Examiner*—Jacob Y. Choi
(74) *Attorney, Agent, or Firm*—Sughrue Mion, PLLC

(57) ABSTRACT

A text fixture (1) comprises apparatus (4) for verifying the color and brightness of light emitted from LEDs (5) of a printed circuit board (3). A base (6) of the fixture (1) supports the printed circuit board (3) during testing. A mounting panel (14) locates ends (15) of a plurality of optical fibers (10) adjacent the LEDs (5) on the printed circuit board (3), and ends (21) of ht optical fibers (10) are terminated in a terminating panel (20) adjacent an image sensing panel (11). The image sensing panel (11) comprises an array of individually addressable light and color sensitive pixels (25) onto which light from the optical fibers (10) is incident. An analysing circuit (12) scans the pixels (25) for determining the brightness values and the tristimulus values of the incident light, and a control circuit (9) compares the tristimulus values and brightness values with reference tristimulus and brightness values for verifying the color and brightness of the light emitted by the respective LEDs (5).

24 Claims, 5 Drawing Sheets

APPARATUS FOR TESTING A LIGHT EMITTING DEVICE, AND A METHOD FOR TESTING LIGHT EMITTING DEVICES

This is a National Stage entry under 35 U.S.C. § 371 of Application No. PCT/IE01/00055 filed Apr. 27, 2001; the above noted prior applications are all hereby incorporated by reference.

The present invention relates to apparatus for testing at least one light emitting device on a panel, for example, one or more light emitting diodes (LEDs) on a printed circuit board, and in particular, the invention relates to such apparatus for verifying if the colour of light being emitted by the light emitting device is of the correct colour. The invention also relates to a method for testing a light emitting device.

Printed circuit boards, for use in computers, and other electronic assemblies include many LEDs and in general the LEDs are of different colour for signifying different operational aspects of the circuits of printed circuit board. For example, the LEDs may emit light in the red spectrum, the yellow spectrum, the green spectrum, the blue spectrum, and indeed, any other of the colour spectrums. When testing components on a printed circuit board, it is also important to verify that the LEDs are operational, and also it is important to be able to verify that the LEDs are emitting light of the correct colour, and of the correct brightness.

It is common practice to test the functionality of the circuits and the components of a printed circuit board by placing the printed circuit board in a functional test station which typically, comprises a test fixture, which in general, comprises what is commonly referred to as a "bed of nails". Test signals are applied to the printed circuit board, and voltages generated across the various components and key parts of the circuits are monitored for verifying the operational characteristics of the components and the circuit. However, in general, visual inspection is required for determining if the LEDs are operational, and if they are emitting light of the correct or desired colour, in other words, to establish if the correct LED or LEDs have been assembled onto the printed circuit board, and if so if they are operational. Such visual verification of LEDs is far from error-proof. Firstly, a failed LED may be overlooked by an operator due to operator fatigue. Additionally, an operator can confuse a LED of one colour for that of another colour, again as a result of operator fatigue. Additionally, visual inspection tends to be relatively slow since the operational characteristics and colour of the LEDs must be individually inspected, and thus sequentially inspected which tends to be a relatively slow and time consuming process.

Automatic vision testing systems are available which test for both the operational characteristics and the colour of LEDs on a printed circuit board, and indeed, other light sources. Typically, such vision testing systems rely on a video camera and a frame grabber. The video camera images the printed circuit board, and the frame grabber grabs an image of the printed circuit board when the LEDs are powered up. The image is subsequently processed and interpreted by a computer. However, such automatic vision testing systems tend to be relatively expensive, relatively large and unwieldy. Additionally, since the image of the printed circuit board grabbed from the video camera contains a significant amount of redundant information relatively sophisticated algorithms and relatively large amounts of computer processing power are required to extract the relevant data from the image in order to verify that the LEDs are operational, and are emitting light of the correct colour.

U.S. Pat. No. 4,808,815 of Langley discloses apparatus for testing if LEDs on a printed circuit board are operational. The apparatus of Langley comprises a base on which the printed circuit board is placed. A plurality of optical fibers are located in a panel above the printed circuit board with the ends of the respective optical fibers located in close proximity to the corresponding LEDs the operation of which are to be tested. The optical fibers at their other end terminate in respective light sensors, which in response to light emitted by the respective corresponding LEDs and transmitted through the optical fibers to the light sensors output a signal in the event of light being detected, and no signal in the event of no light being detected. The output signals from the respective light sensors are analysed by analysing circuitry for verifying the operationality of the respective LEDs. However, this apparatus of Langley is only suitable for determining if the LEDs are emitting light or not, it does not verify the colour of light being emitted by the respective LEDs. Additionally, since each optical fiber must terminate in an individual corresponding light sensor where a printed circuit board contains a large number of LEDs a corresponding large number of light sensors are required, thus leading to excessive cost and analysing procedures.

There is therefore a need for apparatus for testing at least one light emitting device on a panel for determining if the device is emitting light, and if the light being emitted is of the correct colour. There is also a need for a method for testing one or more light emitting devices on a panel for verifying the colour of the light emitted by the devices which overcome the problems of known apparatus and methods.

The present invention is directed towards providing such an apparatus and method.

SUMMARY OF THE INVENTION

According to the invention there is provided apparatus for testing at least one light emitting device on a panel, the apparatus comprising, a light collecting means for individually collecting light from each of the light emitting devices, one light, collecting means being provided for each light emitting device to be tested, and an analysing means for analysing light from the respective light collecting means, wherein a verifying means is provided for verifying if each light emitting device is emitting light of the correct colour.

In one embodiment of the invention the analysing means comprises a means for determining the tristimulus value of the light collected from each light emitting device for facilitating verification of the light colour by the verifying means.

Preferably, a storing means for storing reference tristimulus values for the respective light emitting devices is provided, and the verifying means comprises a comparing means for comparing the determined tristimulus values of each light emitting device with the corresponding reference tristimulus value.

In another embodiment of the invention the analysing means comprises a means for determining the brightness value of the light collected from each light emitting diode for facilitating verification of the brightness of the light by the verifying means.

Preferably, a storing means for storing reference brightness values for the respective light emitting diodes is provided and the verifying means comprises a comparing means for comparing the determined brightness values of the respective light emitting devices with the corresponding reference brightness values.

Advantageously, the analysing means comprises an image sensing panel comprising a plurality of pixels arranged in a matrix of rows and columns, and the respective collecting means direct collected light onto the image sensing panel at respective spaced apart locations so that the collected light from the respective light emitting devices is incident on corresponding pixels of the image sensing panel. Preferably, the respective pixels of the image sensing panel are individually addressable.

In another embodiment of the invention a reading means is provided for reading signals outputted by the respective pixels and for relaying the read signals to the means for determining the tristimulus value and brightness value of the light from each light emitting device. Preferably, the means for determining the tristimulus value and the brightness of the light emitted by each light emitting device averages the signal values read from respective pixels of groups of pixels in respective areas adjacent where light from the respective light emitting devices is incident on the image sensing panel.

In one embodiment of the invention a terminating means is provided for terminating the respective collecting means adjacent the image sensing panel. Preferably, the terminating means comprises a terminating panel having a plurality of locating means for locating the respective collecting means at spaced apart locations in the terminating panel. Advantageously, the locating means are arranged in a row in the terminating panel. Preferably, each locating means comprises a locating bore extending through the terminating means. Ideally, the terminating means extends parallel to the image sensing panel.

In another embodiment of the invention a mounting means is provided for mounting each collecting means adjacent the panel to be tested with the respective collecting means being located in close proximity to the corresponding light emitting devices.

Preferably, the mounting means comprises a plurality of positioning means for positioning the respective collecting means in close proximity to the corresponding light emitting devices. Advantageously, each positioning means comprises a positioning bore extending through the mounting means for positioning the collecting means in close proximity to the corresponding light emitting device. Ideally, the mounting means comprises a mounting panel.

In a further embodiment of the invention each collecting means comprises an optical fiber for extending between the corresponding light emitting device and the analysing means.

In one embodiment of the invention the mounting means mounts each optical fiber with a corresponding end of the optical fiber spaced apart from the corresponding light emitting device a distance from the light emitting device not greater than 2 mm.

Preferably, the mounting means mounts each optical fiber with its corresponding end spaced apart from the corresponding light emitting device a distance from the corresponding light emitting device lying within the range of 0.5 mm to 2 mm. Advantageously, each optical fiber extends through the corresponding positioning bore in the mounting means and terminates adjacent a corresponding end of the corresponding bore.

In another embodiment of the invention the terminating means mounts the optical fibers with their respective corresponding ends adjacent the image sensing panel but spaced apart from the image sensing panel a distance not greater than 2 mm, and preferably, a distance of approximately 0.5 mm.

Alternatively, a focusing lens is located between the terminating means and the image sensing panel for focusing light from the respective optical fibers on the image sensing panel.

In one embodiment of the invention the apparatus is adapted for verifying the colour of light emitted from a light emitting diode, and preferably, for verifying the brightness of light emitted by the light emitting diode.

In another embodiment of the invention the apparatus is adapted for testing light emitting diodes mounted in a printed circuit board panel.

In a further embodiment of the invention the apparatus is adapted for mounting in a test fixture.

In a still further embodiment of the invention the apparatus is adapted for mounting in a test fixture for testing parameters of components and parts of circuits of a printed circuit board.

In one embodiment of the invention at least the mounting means is adapted for mounting in a test fixture.

In another embodiment of the invention the mounting means is adapted for mounting adjacent a panel of a housing of apparatus to be tested in which the light emitting devices are located on the panel, the positioning means of the mounting means positioning the respective collecting means adjacent to the respective light emitting devices on the panel of the apparatus to be tested.

In a further embodiment of the invention the apparatus further comprises a control means for controlling a supply of power to the LEDs.

Further, the invention provides a test fixture for testing electronic components connected to a printed circuit board, the test fixture comprising the apparatus according to the invention.

In one embodiment of the invention the mounting means of the apparatus is mounted in the test fixture so that the mounting means can be urged towards the printed circuit board for bringing the corresponding ends of the corresponding optical fibers into close proximity with the corresponding light emitting devices to be tested.

In another embodiment of the invention the test fixture comprises a jig carrying a bed of nails.

Additionally, the invention provides a method for testing a light emitting device on a panel for determining if the light being emitted from the light emitting device is of the correct colour, the method comprising the steps of placing the panel with the at least one light emitting device in the apparatus according to the invention powering each light emitting device on the panel, analysing the light collected by each collecting means from the corresponding light emitting device, and verifying if the light received from the collecting means from the corresponding light emitting device is of the correct colour.

In one embodiment of the invention the method further comprises determining the tristimulus values of the light received from the respective light emitting devices and comparing the determined tristimulus values with corresponding reference tristimulus values for verifying if the light emitted from the respective light emitting devices is of the correct colour.

In another embodiment of the invention the method further comprises verifying if the light received from the respective collecting means from the corresponding light emitting device is of the correct brightness.

In a further embodiment of the invention the method further comprises determining the brightness values of the light received from the respective light emitting devices and comparing the determined brightness values with corresponding reference brightness values for verifying if the light emitted from the respective light emitting devices is of the correct brightness.

The advantages of the invention are many. A particularly important advantage of the apparatus according to the invention is that it provides a relatively simple and inexpensive apparatus for testing light emitting devices on a panel, for example, LEDs on a printed circuit board, and as well as providing a test for verifying if the light emitting devices are emitting light, the apparatus according to the invention also verifies if the light being emitted by the light emitting devices is of the correct colour and brightness. Additionally, the apparatus according to the invention is particularly suitable for retrofitting into a test fixture, of the type comprising a "bed of nails". A further advantage of the invention is achieved when light from the light emitting devices is relayed to the image sensing panel through optical fibers, in that the need for lenses and other light focusing devices is avoided, or in cases where it is desired to focus light from the optical fibers onto the image sensing panel, only one lens is required. Furthermore, by virtue of the fact that the light from each light emitting device is directed onto an image sensing panel the need for a plurality of individual light sensors at the end of each collecting means is avoided.

BRIEF DESCRIPTION OF THE DRAWINGS

The invention will be more clearly understood from the following description of some preferred embodiments thereof which are given by way of example only with reference to the accompanying drawings, in which.

DETAILED DESCRIPTION OF THE INVENTION

Figure 2:
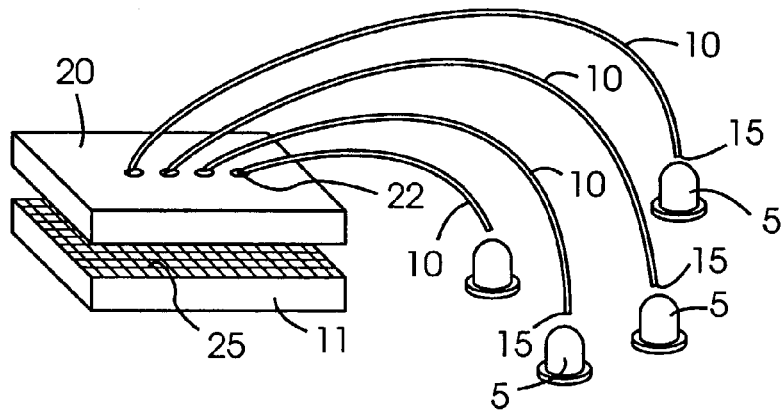
FIG. 2 is a perspective view of a part of the apparatus of FIG. 1.
Figure 1:
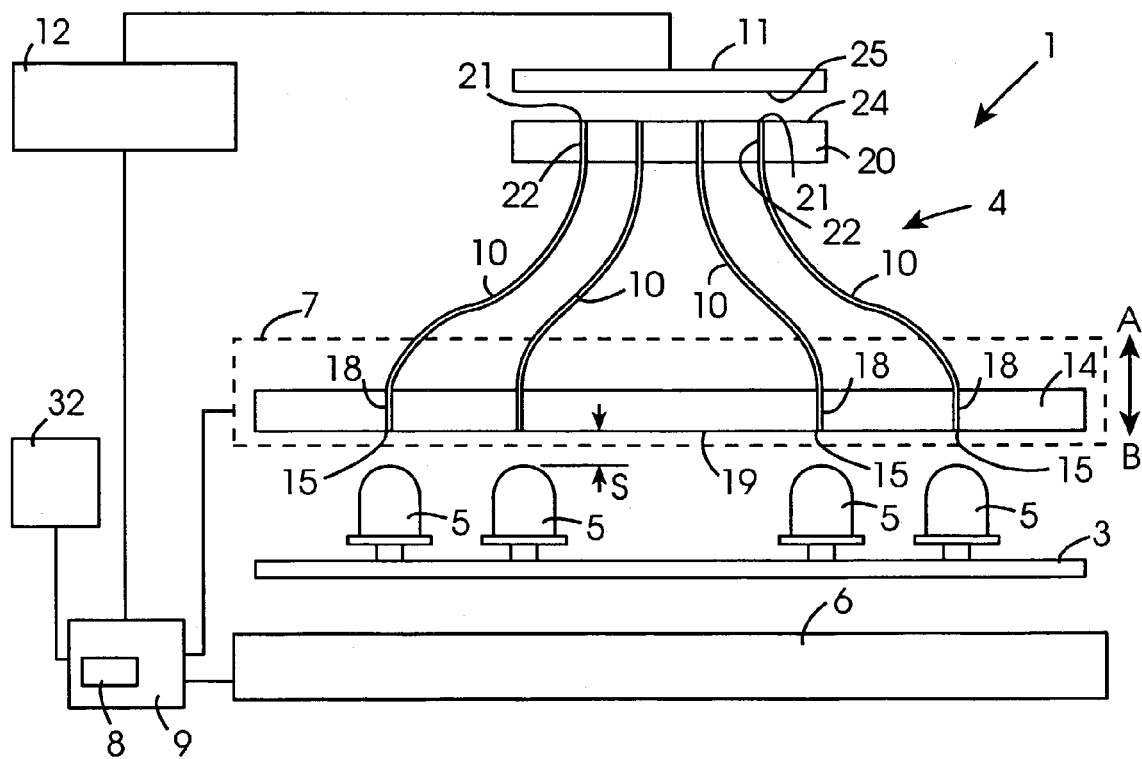
FIG. 1 is a schematic front elevational view of a test fixture according to the invention for testing a printed circuit board, which incorporates apparatus also according to the invention for testing LEDs on a printed circuit board.

Referring to the drawings and initially to FIGS. 1 to 4 there is illustrated a test fixture according to the invention indicated generally by the reference numeral 1 for testing printed circuit boards 3. The test fixture 1 comprises apparatus also according to the invention which is indicated generally by the reference numeral 4 for testing LEDs 5 of the printed circuit boards 3, and for verifying if the LEDs 5 are emitting light and if the emitted light from the respective LEDs 5 is of the correct colour and brightness. The test fixture 1 comprises a base 6 for sequentially receiving the printed circuit boards 3. Locating pins (not shown) are provided extending upwardly from the base 6 for engaging corresponding bores (not shown) in the printed circuit boards 3 for locating and aligning the printed circuit board 3 on the base 6. Guide pins (also not shown) extending upwardly from the base 6 slideably engage corresponding bushed bores (also not shown) in a mounting frame 7 for guiding and aligning the mounting frame 7 with the base 6, and in turn with a printed circuit board 3 mounted on the base 6. The mounting frame 7 is moveable upwardly and downwardly in the directions of the arrows A and B, respectively, relative to the base 6 between a lower test position adjacent the base 6 and a raised position spaced apart from the base 6, for facilitating placing and removal of printed circuit boards 3 on the base 6.

A carrier plate (not shown) is located in the base 6 and carries a plurality of electrically conductive pins (also not shown) for engaging corresponding electrically conductive parts of the tracks and/or components of the printed circuit board 3 for carrying out tests of the components and/or circuits of the printed circuit board 3. Such a combination of a carrier plate and a plurality of electrically conductive contact pins will be well known to those skilled in the art, and typically is referred to as "a bed of nails". The carrier plate (not shown) is moveable upwardly in the base 6 for engaging corresponding electrically conductive points of the tracks on the underside of the printed circuit board 3 with the electrically conductive pins (not shown).

A control means, namely, a control circuit 9 operating under the control of a microcontroller 8 controls the operation of the test fixture 1. The control circuit 9 also under the control of the microcontroller 8 applies appropriate test signals to appropriate pins of the electrically conductive pins of the "bed of nails" in the base 6 for carrying out tests on the components and circuits, as well as for powering the LEDs 5 of the printed circuit board 3. The microcontroller 8 reads signals from appropriate pins of the electrically conductive pins of the "bed of nails" for determining if the components and/or circuits of the printed circuit board 3 are within desired specifications.

The construction of such test fixtures and their operation will be well known to those skilled in the art, and it is not intended to describe the test fixture 1 in further detail.

Turning now to the apparatus 4 for testing the LEDs 5, the apparatus 4 comprises a plurality of collecting means provided by respective optical fibers 10 for collecting light from the corresponding LEDs 5, one optical fiber 10 being associated with each LED 5. The optical fibers 10 relay light from the corresponding LEDs 5 to an image sensing panel 11 of an analysing means, namely, analysing circuit 12, both of which will be described in more detail below.

A mounting means, namely, a mounting panel 14 located within the mounting frame 7 positions ends 15 of the optical fibers 10 at positions in close proximity to the LEDs 5 when the mounting frame 7 is in the test position. The mounting panel 14 is moveable upwardly and downwardly in the direction of the arrows A and B with the mounting frame 7. A plurality of positioning means, namely, positioning bores 18 extending through the mounting panel 14 tightly engage and position the optical fibers 10 at positions with the ends 15 of the optical fibers 10 aligned with the corresponding LEDs 5. Each optical fiber 10 extends through the corresponding positioning bore 18 and terminates at its end 15 adjacent a lower major surface 19 of the mounting panel 14, so that when the mounting frame 7 is in the test position the ends 15 of the optical fibers 10 are spaced apart from the LEDs 5 a distance "s" which lies in the range 0.5 mm to 2 mm.

A terminating means, namely, a terminating panel 20 terminates the other ends 21 of the optical fibers 10 adjacent the image sensing panel 11. A plurality of locating means, namely, spaced apart locating bores 22 extend through the terminating panel 19 and are arranged in a row for locating the ends 21 of the optical fibers 10 in a corresponding row adjacent the image sensing panel 11. The optical fibers 10 extend through the locating bores 22 and terminate at a major surface 24 which faces the image sensing panel 11.

The image sensing panel 11 comprises an array of light and colour sensitive pixels 25 which are individually addressable and are arranged in a matrix of rows and columns for receiving incident light from the ends 21 of the optical fibers 10. Some of the pixels 25 are sensitive to red light, some are sensitive to green light and some are sensitive blue light, and the pixels 25 are arranged in a Bayer pattern. In this embodiment of the invention the image sensing panel 11 is a Photobit PB100 supplied by Photobit Corp. of the U.S. Alternatively, the image sensing panel 11 may be a Sony ILX524 sensor panel. The terminating panel 20 spaces the ends 21 of the optical fibers 10 from the image sensing panel 11 a distance of approximately 0.5 mm. The fact that the ends 21 of the optical fibers 10 are slightly spaced apart from the image sensing panel 11 causes light from each LED 5 to be incident on a number of corresponding adjacent pixels 25, namely, a group of pixels 25 of the image sensing panel 11. However, the spacing between the respective ends 21 of the optical fibers 10 in the locating bores 22 is sufficient to avoid light from one optical fiber 10 overlapping with pixels 25 of groups corresponding to adjacent optical fibers 10.

Figure 3:
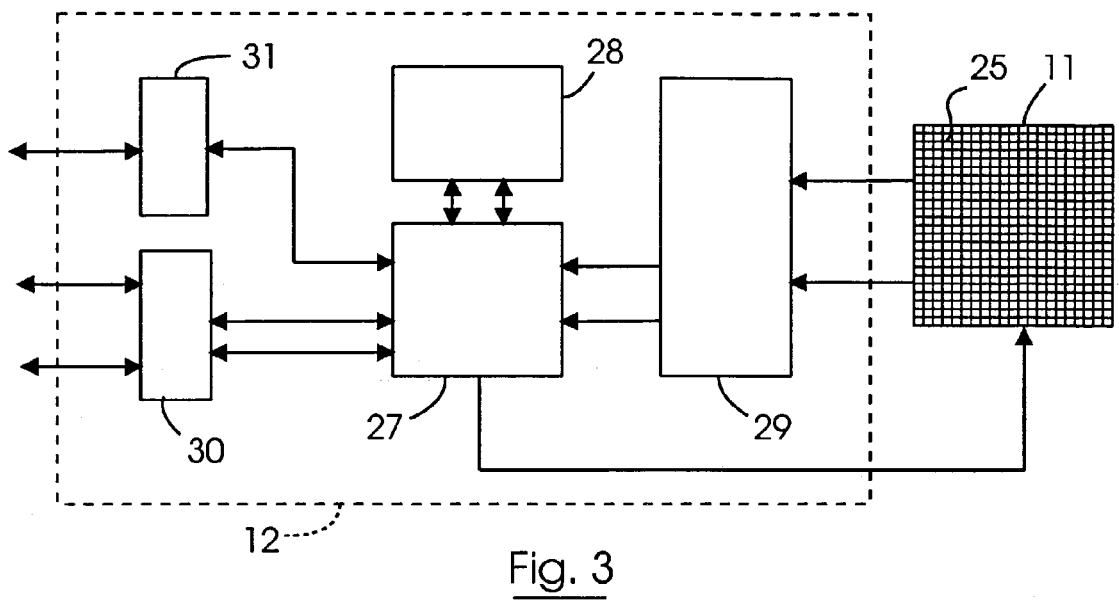
FIG. 3 is a block representation of circuitry of the apparatus of FIG. 2.
Figure 4:
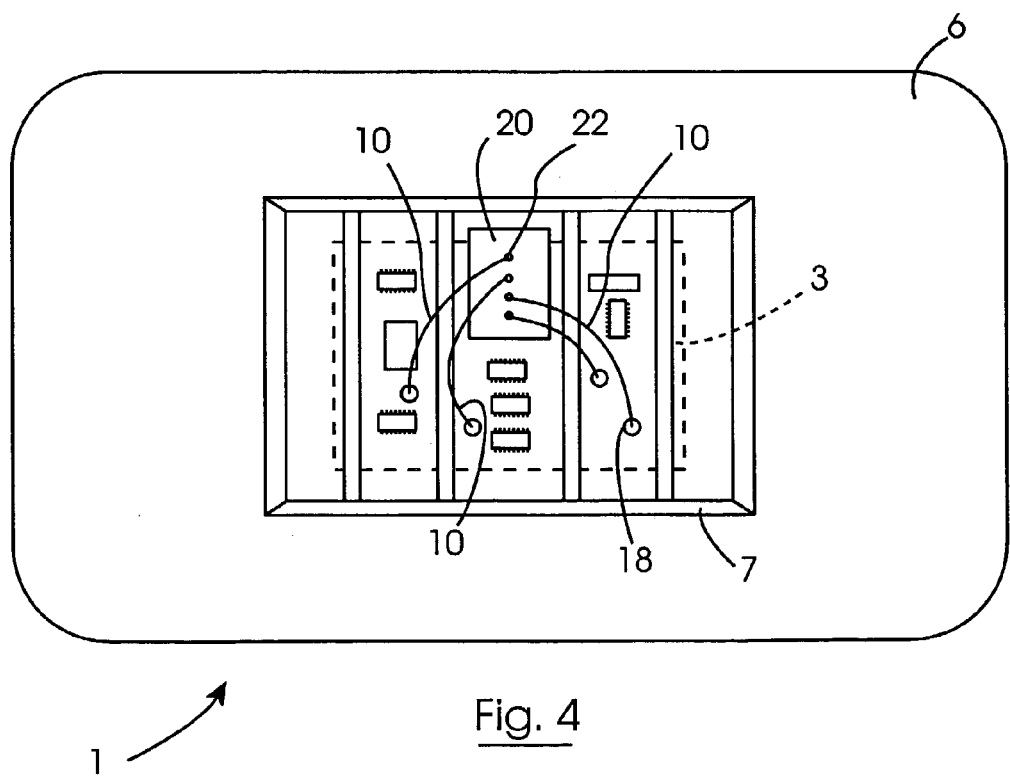
FIG. 4 is a schematic plan view of the test fixture of FIG. 1.

Referring in particular to FIG. 3, the analysing circuit 12 comprises a microprocessor 27 which under the control of suitable software in a ROM 28 scans and reads pixel values from the pixels 25 into a buffer memory 29 when the LEDs 5 are powered by appropriate signals applied by the microcontroller 8 to the printed circuit board 3 through the "bed of nails". The microprocessor 27 averages the pixel values of each group of pixels 25 corresponding to the respective optical fibers 10, and computes the brightness and tristimulus values of each LED 5 from the average pixel values of the respective groups of pixels 25. The microcontroller 8 of the control circuit 9 reads the brightness and tristimulus values from the microprocessor 27 through a parallel port 30 or a serial port 31. A comparing means which is implemented in the microcontroller 8 by suitable software compares the read brightness and tristimulus values of the LEDs 5 with reference brightness and tristimulus values for the corresponding LEDs 5, and determines if the LEDs 5 are operating at the correct brightness and are of the correct colour. A visual display unit 32 displays the brightness and tristimulus values of the respective LEDs 5, and also displays appropriate values of the other components and circuits of the printed circuit board 3 which are determined by the microcontroller 8 from signals read from the appropriate pins of the "bed of nails". The visual display unit 32 also displays the status of the printed circuit board 3, whether it has passed or failed the test.

An appropriate operating mechanism for raising and lowering the mounting frame 7 in the direction of the arrows A and B relative to the base 6 is provided but not illustrated, as is an appropriate operating mechanism for raising and lowering the carrier plate (not shown) in the base 6 for engaging and disengaging the "bed of nails" with the printed circuit board 3. Such operating mechanisms will be well known to those skilled in the art.

The terminating ends 15 and 21 of the optical fibers 10 are cut at right angles to the fiber axis and polished smooth so as to efficiently collect and output light. The core diameter of the optical fibers 10 can range between 0.25 mm to 3 mm.

While the optical fibers of larger core diameter collect more light optical fibers of diameter greater than 3 mm tend to be bulky and difficult to route around tight corners. While optical fibers in the range of 0.25 mm to 3 mm are of smaller diameter and collect less light they are relatively easy to handle particularly where a printed circuit board is provided with a large number of LEDs to be tested. Tests have indicated that optical fibers of core diameter in the range of 0.5 mm to 1 mm provide an optimum trade off between manageability of the optical fibers and the light collecting capacity of the optical fibers. In order to ensure accuracy the optical fibers 10 are secured in the bores 18 and 22 by an epoxy adhesive, and the optical fibers 10 are a relatively tight fit in the bores 18 and 22 in the mounting panel 14 and the terminating panel 20, respectively. By maintaining the ends 15 of the optical fibers 10 adjacent the LEDs 5 within 0.5 mm to 2 mm light is efficiently collected from the LEDs 5 without the risk of damage to the optical fibers 10 from the LEDs 5.

In use, the printed circuit board 3 to be tested is engaged on the base 6, and the mounting frame 7 is lowered in the direction of the arrow B for urging the mounting panel 14 into the test position with the ends 15 of the optical fibers 10 located to receive light from the corresponding LEDs 5. The carrier plate (not shown) in the base 6 is urged upwardly for engaging the printed circuit board 3 with the pins of the "bed of nails". Appropriate signals are applied to the printed circuit board 6 by the control circuit 9 through the pins of the "bed of nails". On the LEDs 5 being powered the pixels 25 of the image sensing panel 11 are scanned and the pixel values are read into the buffer memory 29. The microprocessor 27 averages the pixel values of each group of pixels 25 which correspond to the respective fibers 10, and computes the brightness and tristimulus values of the respective LEDs 5. The microcontroller 8 in the control circuit 9 reads the brightness and tristimulus values from the microprocessor 27 of the respective LEDs 5 and by comparing the respective values with reference brightness and tristimulus values for the respective LEDs 5 the microcontroller 8 determines if the LEDs 5 are operating at the correct brightness value and are of the correct colour. The status of each of the LEDs 5 is displayed on the visual display unit 32. Simultaneously or sequentially with the testing of the LEDs 5 the microcontroller 8 also reads signals from the components and circuits of the printed circuit board 3 for determining if the components and the circuits of the printed circuit board 3 are within desired specifications. The results of these tests are also displayed on the visual display unit 32 as is the pass or fail status of the printed circuit board 3.

Figure 5:
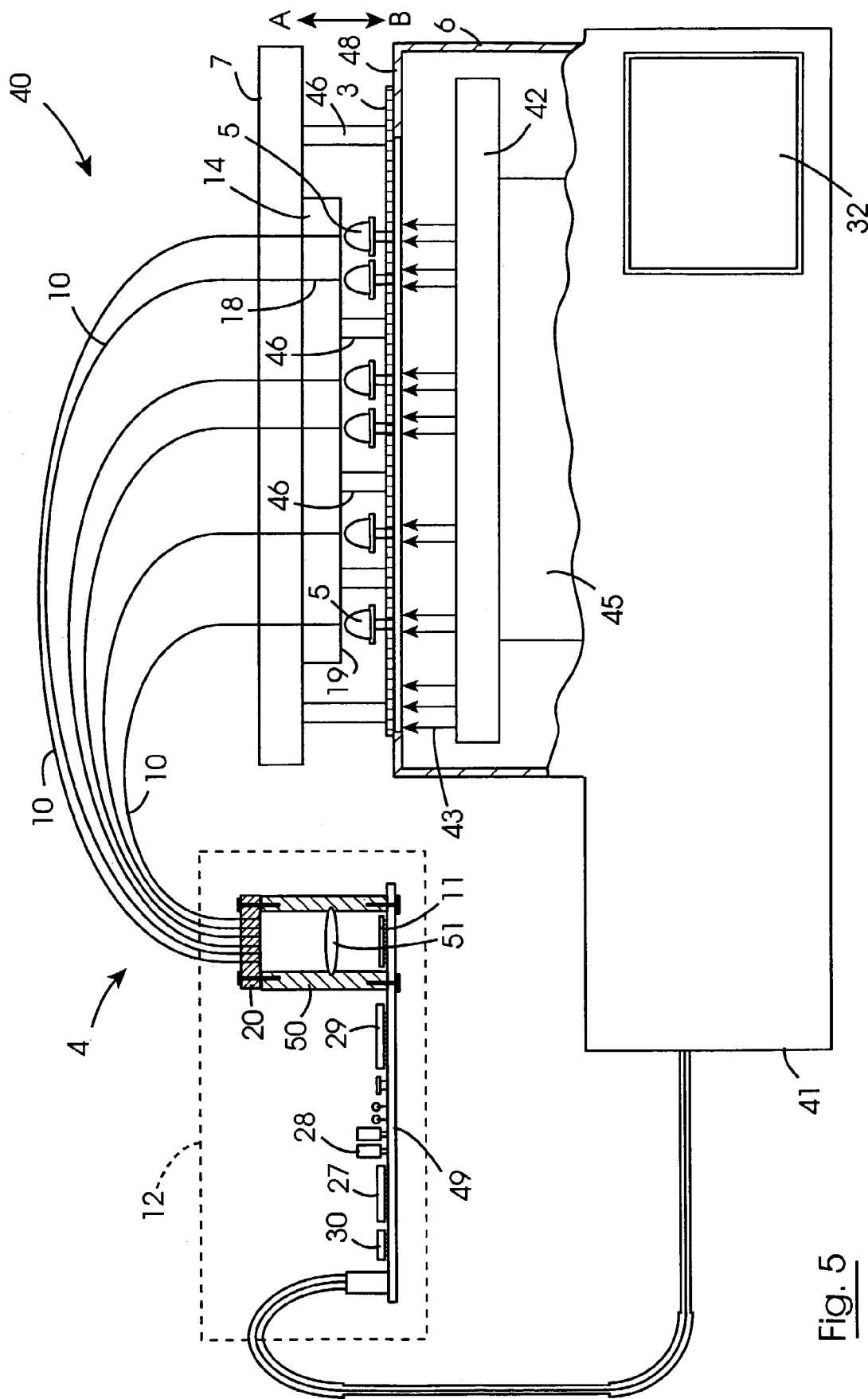
FIG. 5 is a partly cut away schematic front elevational view of a test fixture according to another embodiment of the invention.
Figure 6:
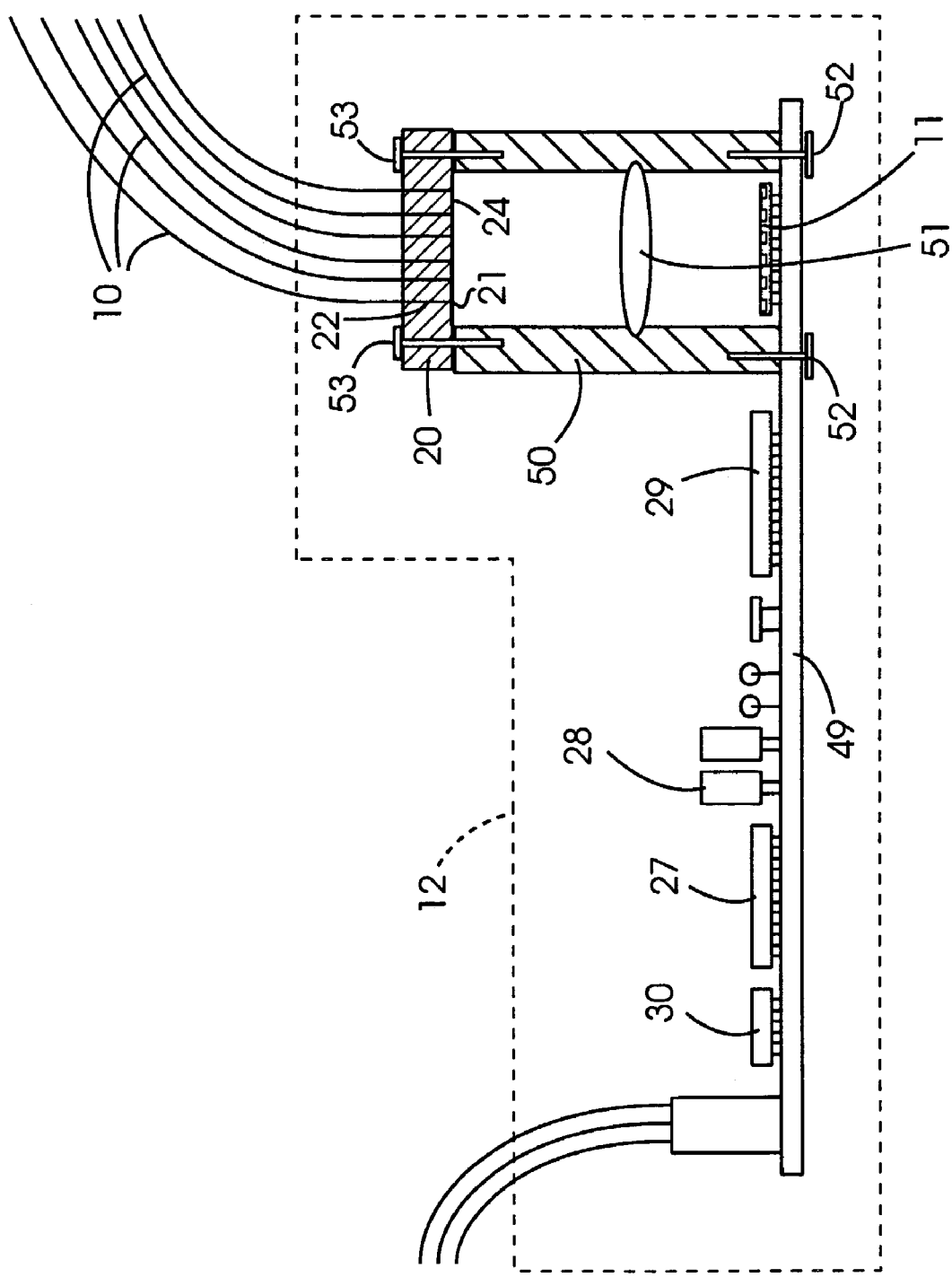
FIG. 6 is a transverse cross-sectional front elevational view of a portion of apparatus of the test fixture of FIG. 5.

Referring now to FIGS. 5 and 6 there is illustrated a test fixture according to another embodiment of the invention indicated generally by the reference numeral 40. The test fixture 40 is substantially similar to the test fixture 1 and similar components are identified by the same reference numerals. In this embodiment of the invention the control circuit and the microcontroller for controlling the operation of the test fixture 40 and for applying test signals to the printed circuit board 3 are housed in a housing 41 of the base 6, and are not illustrated. The visual display unit 32 is provided on the housing 41. Additionally, in this embodiment of the invention the carrier plate which is indicated by the reference numeral 42 and the electrically conductive contact pins 43 which form the "bed of nails" are illustrated within the housing 41. A carrier member 45 within the housing 41 supports the carrier plate 42 and is urged upwardly and downwardly for by an pneumatic ram (not shown) for bringing the contact pins 43 into and out of engagement with the printed circuit board 3. A plurality pressure members 46 extend downwardly from the mounting frame 7 for engaging the printed circuit board 3 when the mounting frame 7 is in the test position for urging the printed circuit board 3 downwardly onto a printed circuit board receiving platform 48 and for in turn supporting the printed circuit board 3 against the upward force of the contact pins 43 for ensuring good electrical contact between the contact pins 43 and the appropriate electrically conductive tracks of the printed circuit board 3 to which the test signals are to be applied and read back from the printed circuit board 3. An operating mechanism for urging the mounting frame 7 in the direction of the arrows A and B between the test and release position is also provided but not illustrated. Locating pins and guide pins, neither of which are illustrated are provided for locating the printed circuit board on the platform 48 and for aligning the mounting frame 7 with the base 6.

Turning now to the analysing circuit 12, the analysing circuit 12 comprises a printed circuit board 49 on which the microprocessor 27, the ROM 28, the buffer memory 29 and the parallel and serial ports 30 and 31 are mounted. Additionally, the image sensing panel 11 is also mounted on the printed circuit board 49. However, in this embodiment of the invention the image sensing panel 11 is circular in plan view. Additionally. in this embodiment of the invention the terminating panel 20 is mounted on a lens accommodating housing 50. The lens accommodating housing 50 is of tubular construction and is of circular transverse cross-sectional area, and accommodates a lens 51 for focusing light from the optical fibers 10 onto corresponding groups of pixels 25 of the image sensing panel 11. The lens 51 is a double convex lens with an appropriate diameter and focal length. In practice, it is envisaged that the diameter of the lens may lie in the range 5 mm to 25 mm, and the focal length may lie in the range 4 mm to 30 mm. However, in this embodiment of the invention the lens is approximately 12 mm in diameter with a focal length of 5 mm. Screws 52 secure the lens accommodating housing 50 to the printed circuit board 49 while screws 53 secure the terminating panel 20 to the lens accommodating housing 50.

It has been found that by focusing the light from the optical fibers 10 onto the image sensing panel 11 through the lens 51 a sharper image of the light from each optical fiber 10 is focussed on the image sensing panel 11, and thus the danger of light from one optical fiber overlapping with pixels of groups corresponding to other optical fibers does not arise. Additionally, by focusing the light from the optical fibers through the lens 51 the number of pixels onto which the light is focussed is reduced, thus reducing the processing time required for determining the brightness and tristimulus values of the respective LEDs and also leading to more accurate values.

Otherwise, the test fixture 40 is similar to the test fixture 1 and its operation is likewise similar.

Figure 7:
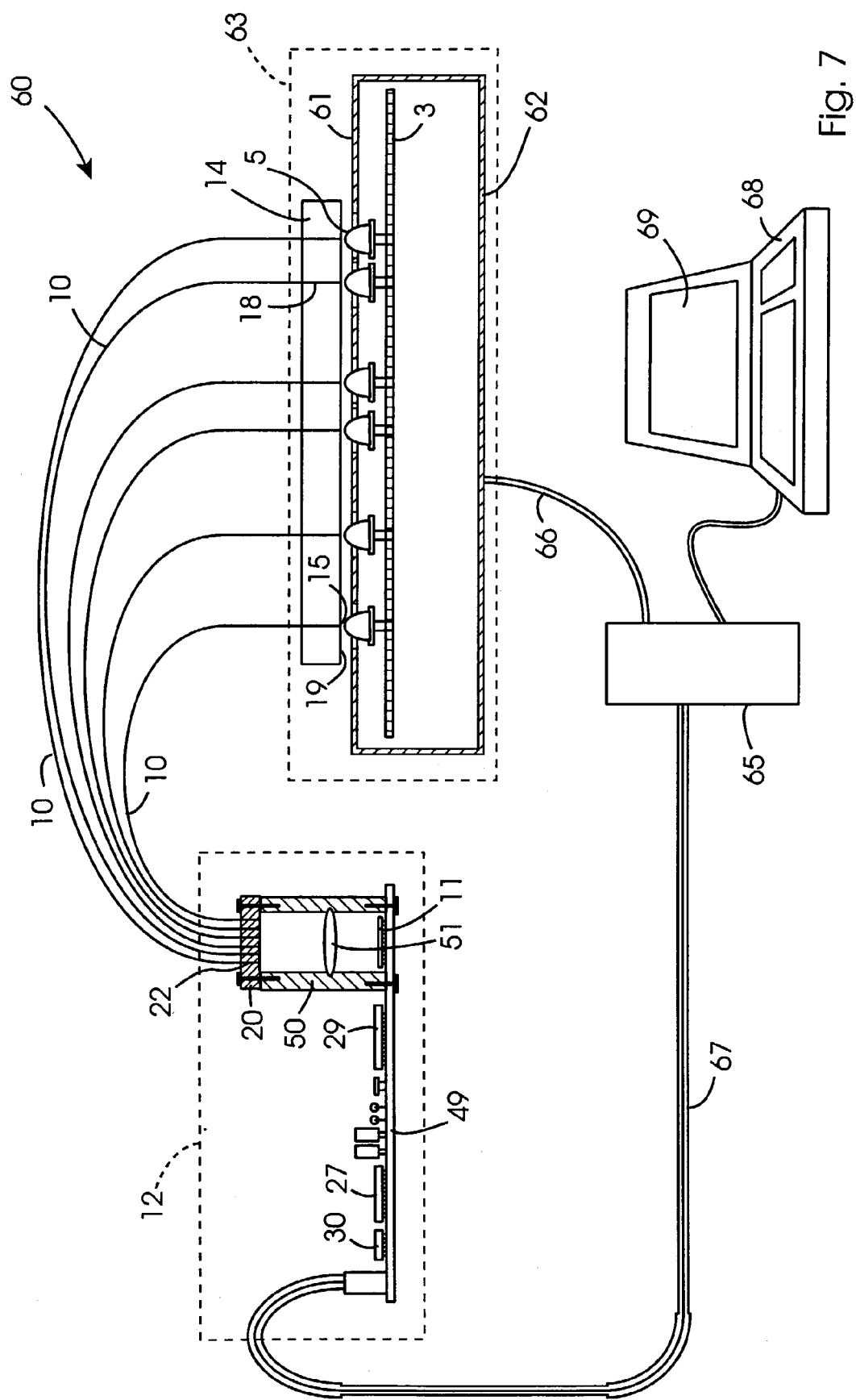
FIG. 7 is a schematic front elevational view of a test fixture according to a still further embodiment of the invention.

Referring now to FIG. 7 there is illustrated a test fixture according to another embodiment of the invention, which in this case is provided by a test jig indicated generally by the reference numeral 60. The test jig 60 is dedicated to testing LEDs 5 only, which in this case are located in a panel 61 of apparatus to be tested, namely, a personal computer 62. Parts of the test jig 60 are substantially similar to corresponding parts of the test fixture 1 and the apparatus 4 described with reference to FIGS. 1 to 4, and where such parts are similar, similar components are identified by the same reference numerals. The test jig 60 comprises a support jig 63 within which the mounting panel 14 is located. The support jig 63 is adapted for receiving and positioning the personal computer 62 relative to the mounting panel 14 so that the ends 15 of the optical fibers 10 are appropriately positioned relative to the LEDs 5. In this embodiment of the invention there is no need for the mounting panel 14 or the support jig 63 to be moveable relative to each other, since the personal computer 62 to be tested can be slid into and out of the support jig 63 beneath the mounting panel 14, and the mounting panel 14 is located in the support jig 63 so that when the personal computer 62 is located in the support jig 63 the LEDs 5 are correctly positioned relative to the ends 15 of the optical fibers 10.

In this embodiment of the invention the analysing circuit 12 is similar to the analysing circuit 12 of the test fixture 40, and similar components are identified by the same reference numerals. The test fixture 60 is controlled by a controlling means, namely, a controlling personal computer 65 which powers the personal computer 62 through a connecting cable 66 for in turn powering the LEDs 5. A keyboard 68 and a visual display screen 69 of the controlling personal computer 65 are also provided. The analysing circuit 12 is operated under the control of the controlling computer 65 to read the pixel values of the pixels 25 of the image sensing panel 11 and for averaging the pixel values of the respective groups of pixels 25 and for determining the brightness values and the tristimulus values of the respective light emitting diodes 5. Communication between the controlling personal computer 65 and the analysing circuit 12 is carried out through an interface cable 67 through one of the parallel and/or serial ports 30 and 31, respectively. The controlling personal computer 65 compares the brightness values and tristimulus values of the respective LEDs 5 with respective corresponding reference values for determining if the LEDs 5 are operating at the appropriate brightness and are of the correct colour.

Results of the tests are displayed on a visual display screen 69 of the laptop computer 68.

In use, the controlling personal computer 65 powers the personal computer 62 and in turn the LEDs 5. The microprocessor 27 of the analysing circuit 12 reads the pixel values of the pixels 25 of the image sensing panel 11 into the buffer memory 29, and subsequently averages the pixel values of the pixels of the respective groups of pixels corresponding to the optical cables 10. The microprocessor 27 then computes the respective brightness values and tristimulus values of the respective LEDs 5 from the averaged values from the corresponding groups of pixels 25. The controlling personal computer 65 reads the computed brightness and tristimulus values of the respective LEDs 5 and compares them with corresponding reference value for passing of failing the respective LEDs 5 and in turn the personal computer 62. The results of the test are displayed on the visual display screen 69.

While the test fixtures described with reference to FIGS. 1 to 4, and 5 and 6 have been described for testing the circuits and other components of printed circuit boards, it will be readily appreciated that in many cases the test fixture may be provided for testing the LEDs only of a printed circuit board as in the case of the test fixture described with reference to FIG. 7.

It is also envisaged that while the test fixtures according to the invention have been described as having the test signals applied to the printed circuit boards through the "bed of nails" it is envisaged that in certain cases a socket may be provided into which the printed circuit board would be plugged for powering thereof, and/or for applying the test signals therethrough.

Additionally, it is envisaged that where a printed circuit board comprises a large number of LEDs to be tested, the locating bores in the terminating panel may be arranged in a matrix comprising a plurality of rows and columns of locating bores, and the optical fibers would terminate in the locating bores, one optical fiber being located in each locating bore.

While in the embodiment of the invention described with reference to FIGS. 5 and 6 the test fixture has been described as comprising a carrier member for supporting the carrier plate with the "bed of nails", and the carrier member has been described as being moveable upwardly and downwardly by a pneumatic ram for bringing the contact pins of the "bed of nails" into and out of engagement with the printed circuit board, it is envisaged that in a more practical implementation of the test fixture a platform would be provided for supporting the printed circuit board, and the platform would have a plurality of bores extending therethrough for accommodating the contact pins of the "bed of nails". The platform would then be arranged to be drawn downwardly by the application of a vacuum so that the contact pins of the "bed of nails" would project upwardly through the bores extending through the platform for engaging the electrically conductive tracks on the printed circuit board. Such arrangements in such test fixtures will be well known to those skilled in the art.

What is claimed is:

1. Apparatus for testing a plurality of light emitting devices (5) on a panel (3), the apparatus (4) comprising:
   a plurality of light collecting means (10), one light collecting means (10) being provided for each light emitting device (5) for collecting light from the corresponding light emitting device (5),
   an analyzing means (12) for analyzing light from the respective light collecting means (10), and
   a verifying means (8, 27, 65) for verifying that each light emitting device (5) is emitting light of the correct color, wherein the analyzing means (12) comprises
   an image sensing panel (11) comprising a plurality of pixels (25) arranged in a matrix of rows and columns, and the respective collecting means (10) direct collected light onto the image sensing panel (11) at respective spaced apart locations so that the collected light from the respective light emitting devices (5) is incident on corresponding pixels (25) of the image sensing panel (11).

2. Apparatus as claimed in claim 1 wherein the respective pixels (25) of the image sensing panel (11) are individually addressable.

3. Apparatus as claimed in claim 1 wherein the means (12) comprises a means (27) for determining the tristimulus value of the light collected from each light emitting device (5) for facilitating verification of the light color by the verifying means (8, 27, 65).

4. Apparatus as claimed in claim 3 in which a storing means for storing reference tristimulus values for the respective light emitting devices is provided, and the verifying means comprises a comparing means for comparing the determined tristimulus values of the respective light emitting devices with the corresponding reference tristimulus values.

5. Apparatus as claimed in claim 3 wherein the analyzing means (12) comprises a means (27) for determining the brightness value of the light collected from each light emitting diode (5) for facilitating verification of the brightness of the light by the verifying means (27).

6. Apparatus as claimed in claim 5 wherein a reading means (27) is provided for reading signals outputted by the respective pixels (25) and for relaying the read signals to the means (27) for determining the tristimulus value and the brightness value of the light from each light emitting device (5).

7. Apparatus as claimed in claim 6 in which the means for determining the tristimulus value and the brightness value of the light emitted by each light emitting device averages the signal values read from respective pixels of groups of pixels in respective areas adjacent where light from the respective light emitting devices is incident on the image sensing panel.

8. Apparatus as claimed in claim 5 in which a storing means for storing reference brightness values for the respective light emitting diodes is provided, and the verifying means comprises a comparing means for comparing the determined brightness values of the respective light emitting devices with the corresponding reference brightness values.

9. Apparatus as claimed in claim 1 wherein a terminating means (20) is provided for terminating the respective collecting means (10) adjacent the image sensing panel (11), the terminating means (20) comprising a plurality of locating means (22) for locating the respective collecting means (10) at spaced apart locations in the terminating means (20).

10. Apparatus as claimed in claim 9 wherein the locating means (22) are arranged in a row in the terminating panel (20).

11. Apparatus as claimed in claim 9 wherein each locating means (22) comprises a locating bore (22) extending through the terminating means (20).

12. Apparatus as claimed in claim 9 wherein the terminating means (20) extends parallel to the image sensing panel (11).

13. Apparatus as claimed in claim 1 wherein a mounting means (14) is provided for mounting each collecting means (10) adjacent the panel (3) to be tested, the mounting means (14) comprising a plurality of positioning means (18) for positioning the respective collecting means (10) in close proximity to the corresponding light emitting devices (5).

14. Apparatus as claimed in claim 13 wherein each collecting means (10) comprises an optical fiber (10) for extending between the corresponding light emitting device (5) and the analyzing means (12), the mounting means (14) mounting each optical fiber (10) with a corresponding end (15) of the optical fiber (10) spaced apart not more than 2 mm from the corresponding light emitting device (5).

15. Apparatus as claimed in claim 14 wherein a focusing lens (51) is located between the terminating means (20) and the image sensing panel (11) for focusing light from the respective optical fibers (10) on the image sensing panel (11).

16. Apparatus as claimed in claim 14 in which the terminating means mounts the optical fibers with their respective corresponding ends adjacent the image sensing panel, but spaced apart from the image sensing panel a distance not greater than 2 mm.

17. Apparatus as claimed in claim 1 wherein the apparatus (4) is adapted for verifying the color, and the brightness of light emitted from a light emitting diode (5).

18. Apparatus as claimed in claim 1 wherein the apparatus (4) is adapted for testing light emitting diodes (5) mounted on a printed circuit board panel (3).

19. Apparatus as claimed in claim 1 wherein the apparatus (4) is adapted for mounting in a test fixture (1).

20. Apparatus as claimed in claim 1 wherein the mounting means (4) is adapted for mounting in a test fixture (1) for testing parameters of components and parts of circuits of a printed circuit board (3).

21. Apparatus as claimed in claim 1 wherein the mounting means (14) is adapted for mounting adjacent a panel (61) of a housing of apparatus (62) to be tested in which the light emitting devices (5) are located on the panel (61), the mounting means (14) positioning the respective collecting means (10) adjacent to the respective light emitting devices (5) on the panel (61) of the apparatus (62) to be tested.

22. Apparatus as claimed in claim 1 wherein the apparatus further comprises a control means (8,9,65) for controlling a supply of power to the light emitting devices (5).

23. A test fixture for testing electronic components and light emitting devices connected to a printed circuit board (2), the test fixture comprising:
- a base for receiving the printed circuit board,
- a plurality of light collecting means, one light collecting means being provided for each light emitting device for collecting light from the corresponding light emitting device,
- an analyzing means for analyzing light from the respective light collecting means, and
- a verifying means for verifying that each light emitting device is emitting light of the correct color, wherein the analyzing means comprises
- an image sensing panel comprising a plurality of pixels arranged in a matrix of rows and columns, and the respective collecting means direct collected light onto the image sensing panel at respective spaced apart locations so that the collected light from the respective light emitting devices is incident on corresponding pixels of the image sensing panel.

24. A test fixture as claimed in claim 23 wherein the mounting means (14) is mounted in the test fixture (1) so that the mounting means (14) can be urged towards the printed circuit board (5) for bringing of the corresponding collecting means into close proximity with the corresponding light emitting devices (5) to be tested.

* * * * *